United States Patent [19]
Brayton et al.

[11] Patent Number: 6,046,642
[45] Date of Patent: Apr. 4, 2000

[54] AMPLIFIER WITH ACTIVE BIAS COMPENSATION AND METHOD FOR ADJUSTING QUIESCENT CURRENT

[75] Inventors: Daniel C. Brayton, Covina, Calif.; Jeffrey K. Jones, Tempe, Ariz.; Robert S. Kaltenecker, Mesa, Ariz.; Bill Tabano Agar, Jr., Chandler, Ariz.

[73] Assignee: Motorola, Inc., Schaumburg, Ill.

[21] Appl. No.: 09/149,520

[22] Filed: Sep. 8, 1998

[51] Int. Cl.[7] .................................................. H03G 1/30
[52] U.S. Cl. ........................... 330/296; 330/290; 330/310
[58] Field of Search .................................. 330/289, 290, 330/296, 298, 310

[56] References Cited

U.S. PATENT DOCUMENTS

| | | | |
|---|---|---|---|
| 4,105,944 | 8/1978 | Anderson | 330/290 |
| 4,220,930 | 9/1980 | Ahmed | 330/270 |
| 4,547,740 | 10/1985 | Nilsson | 330/298 X |
| 4,789,842 | 12/1988 | Naxera | 330/298 |
| 4,849,712 | 7/1989 | Jarrett | 330/290 X |
| 5,428,316 | 6/1995 | Molnar | 330/253 |
| 5,469,111 | 11/1995 | Chiu | 327/538 |
| 5,488,331 | 1/1996 | Keane et al. | 330/296 |
| 5,689,211 | 11/1997 | Embree | 330/266 |

*Primary Examiner*—Steven J. Mottola
*Attorney, Agent, or Firm*—Rennie William Dover

[57] ABSTRACT

An active bias compensation circuit (110) senses a quiescent current flowing in an amplifier (130) and adjusts the quiescent current to maintain an optimal DC biasing of the amplifier (130) over a wide range of factors, e.g., temperature variation, process variation, history of the amplifier (130), etc. The compensation circuit (110) includes two transistors (101, 102) forming a difference amplifier. A sensing voltage proportional to the quiescent current and a reference voltage are applied to the base electrodes of the two transistors (101, 102), which generates a bias signal in response to a difference between the sensing voltage and the reference voltage. The bias signal adjusts the quiescent current in the amplifier (130).

18 Claims, 2 Drawing Sheets

AMPLIFIER WITH ACTIVE BIAS COMPENSATION AND METHOD FOR ADJUSTING QUIESCENT CURRENT

BACKGROUND OF THE INVENTION

The present invention relates, in general, to amplification circuits and, more particularly, to radio frequency amplifiers.

In a radio frequency (RF) amplifier, especially in a power RF amplifier or a high linearity RF amplifier, the direct current (DC) or quiescent current biasing point is a critical design parameter. The quiescent current of an RF amplifier has significant effects on the characteristics and performance, e.g., linearity, signal distortion, power efficiency, etc., of the amplifier. The optimal DC biasing point of a transistor in an amplifier depends on the application of the amplifier and the characteristics of the transistor, which are affected by temperature variation, process variation, history of the transistor, etc. The DC biasing point changes as the transistor characteristics vary.

One technique for maintaining the optimal DC biasing point is referred to as self bias technique, in which the transistor to be biased also operates as a DC amplifier and the amplified DC signal is used as a feedback to adjust the bias. The self bias technique adversely affects the RF performance of the amplifier and is inappropriate for high performance RF amplifiers. The widely practiced active bias trimming technique can adjust DC biasing points according to process variations of a device, but it cannot adjust the DC biasing points in response to temperature variations and the history of the device. Resetting the biasing points after burning in the device can often lessen but not eliminate the problem of DC biasing point drifting as the device ages. Further, the burning in process is time consuming and costly. A large DC resistance connected in series with the emitter of a bipolar transistor can reduce the temperature sensitivity of the transistor. However, the voltage drop across and the power loss in the large resistance adversely affect the performance of the amplifier that includes the bipolar transistor. Another technique uses a microprocessor controlled active bias control circuit to periodically reset the DC bias points. This technique is complicated and expensive.

Accordingly, it would be advantageous to have an active bias compensation circuit and a method for adjusting a quiescent current so that an optimal quiescent current biasing point is maintained over temperature variation, process variation, and life time of an amplifier. It is desirable for the circuit to be simple and space efficient. It is also desirable for the method to be power efficient and cost efficient. It would be of further advantage for the circuit and the method to be compatible with high performance wide band linear RF amplifiers

DETAILED DESCRIPTION OF THE DRAWINGS

Generally, the present invention provides an active bias compensation circuit for locking an amplifier to optimal operating conditions. An active bias compensation circuit of the present invention senses a quiescent current flowing in an amplifier and adjusts the quiescent current to maintain an optimal direct current (DC) biasing of the amplifier over a wide range of factors, e.g., temperature variation, process variation, history of the amplifier, etc. For example, an active bias compensation circuit in accordance with the present invention reduces or eliminates drain current drift of metal oxide semiconductor (MOS) devices in a radio frequency (RF) amplifier. In one embodiment, an RF amplifier is a multiple stage amplifier that includes several amplification elements comprised of transistors of the same family, i.e., the transistors are the same type of devices as each other and manufactured through substantially the same wafer fabrication processes. The active bias compensation circuit senses a quiescent current in the first amplification element and generates bias signals to adjust quiescent currents in subsequent amplification elements. Because the transistors in different amplification elements are in the same family, their characteristics substantially track each other. Thus, the bias signal generated by the active bias compensation circuit according to the quiescent current in the first amplification element maintains optimal biasing points for subsequent amplification elements. By sensing the quiescent current only in the first amplification element, which usually has a lower quiescent current than subsequent amplification elements, the power efficiency of the amplifier is significantly improved. In addition, the voltage overhead of the subsequent amplification elements is not affected by the sensing process. In another embodiment, an RF amplifier includes a reference element and the active bias compensation circuit senses a quiescent current in the reference element and generates bias signals to adjust quiescent currents in the amplification elements in the amplifier. Because the transistors in the reference element and in the amplification elements are in the same family, they drift substantially in the same way. Therefore, the bias signal generated by the active bias compensation circuit according to the quiescent current in the reference element maintains optimal biasing points for all or selected amplification elements. By sensing the quiescent current only in the reference element, the power efficiency of the amplifier is significantly improved. In addition, the voltage overhead of the amplification elements is not affected by the sensing process. In yet another embodiment, an active bias compensation circuit maintains an optimal biasing point of an RF amplifier. By way of example, the RF amplifier is a high performance RF linear amplifier in a cascode configuration. The active bias compensation circuit uses a difference amplifier to compare a voltage across a sensing resistor serially coupled in a conduction path of the RF linear amplifier with a reference voltage and generates a bias signal to adjust the quiescent current in the RF linear amplifier.

Figure 1:
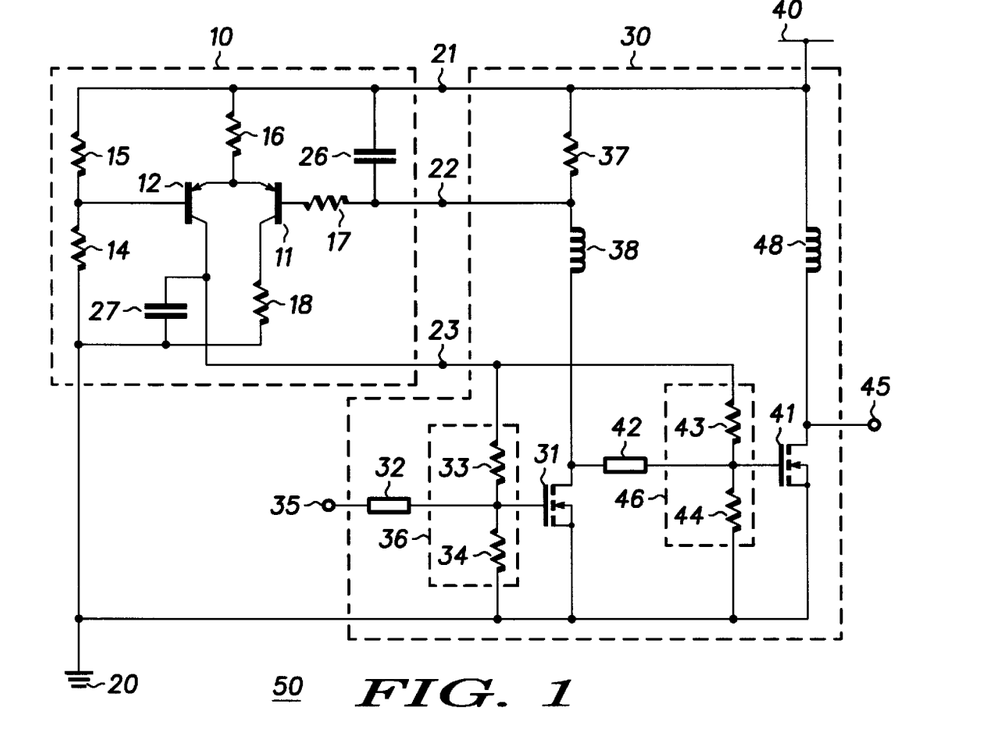
FIG. 1 is a schematic diagram of a bias compensation circuit that adjusts quiescent currents in an amplifier in accordance with a first embodiment of the present invention.

FIG. 1 is a schematic diagram of an RF amplifier 50 in accordance with a first embodiment of the invention. RF amplifier 50 includes an active bias compensation circuit 10 that adjusts quiescent currents in an RF amplification element 30. Compensation circuit 10 is also referred to as a current feedback difference amplifier. For simplicity, amplification element 30 is also referred as an amplifier. Compensation circuit 10 includes a difference amplifier formed by transistors 11 and 12 that monitors and adjusts the quiescent current in amplifier 30. Amplifier 30 is a two stage amplifier that includes two amplification elements. The first amplification element includes a transistor 31 and the second amplification element includes a transistor 41. In an embodiment shown in FIG. 1, transistors 31 and 41 are N channel laterally diffused metal oxide semiconductor (LDMOS) FETs. In this embodiment, transistors 11 and 12 in compensation circuit 10 are preferably PNP bipolar transistors.

A base electrode of transistor 12 is coupled via a resistor 14 to a voltage supply conductor 20. By way of example, voltage supply conductor 20 is at ground potential. The base electrode of transistor 12 is also coupled via a resistor 15 to a first input terminal 21 of compensation circuit 10. A resistor 16 couples an emitter electrode of transistor 11 and an emitter electrode of transistor 12 to input terminal 21. A base electrode of transistor 11 is coupled to a second input terminal 22 of compensation circuit 10 via a resistor 17. A collector electrode of transistor 11 is coupled to voltage supply conductor 20 via a resistor 18. A collector electrode of transistor 12 is connected to an output terminal 23 of compensation circuit 10. Compensation circuit 10 also includes a capacitor 26 coupled between input terminals 21 and 22 and a capacitor 27 coupled between the collector electrode of transistor 12 and voltage supply conductor 20.

Compensation circuit 10 operates on DC signals. Resistor 17 functions as an alternating current (AC) signal blocking element. Capacitors 26 and 27 function as AC signal shunt elements. They are also referred to as AC signal decoupling elements. Although preferred, resistor 17 and capacitors 26 and 27 are optional in compensation circuit 10. In addition, resistor 17 can be replaced with another type of AC signal blocking element such as, for example, an inductor. Transistors 11 and 12 are not limited to being PNP bipolar transistors. They can be replaced with other types of transistors such as, for example, NPN bipolar transistors, field effect transistors (FETs), or the like. As those skilled in the art are aware, for a bipolar transistor, the base electrode functions as a control electrode, and the emitter and collector electrodes function as current conducting electrodes. For a FET, the gate electrode functions as a control electrode, and the source and drain electrodes function as current conducting electrodes.

A gate electrode of FET 31 functions as a DC bias and RF signal input terminal of the first amplification element. A drain electrode of FET 31 functions as a DC current supply and RF signal output terminal of the first amplification element. A gate electrode of FET 41 functions as a DC bias and RF signal input terminal of the second amplification element. A drain electrode of FET 41 functions as a DC current supply and RF signal output terminal of the second amplification element. Preferably, FETs 31 and 41 belong to the same family of devices and, therefore, their characteristics, e.g., threshold voltage variations and drifts, substantially track each other.

The gate electrode of FET 31 is coupled via an impedance matching element 32 to an RF signal input terminal 35 of amplifier 30 for receiving an RF input signal of amplifier 30. Resistors 33 and 34 form a voltage divider 36 coupled between output terminal 23 of compensation circuit 10 and voltage supply conductor 20. An electrode of resistor 33 serves as a first terminal of voltage divider 36 and is connected to output terminal 23 of compensation circuit 10. Another electrode of resistor 33 and an electrode of resistor 34 form a voltage output terminal of voltage divider 36, which is connected to the gate electrode of FET 31. Another electrode of resistor 34 serves as a second terminal of voltage divider 36 and is connected to voltage supply conductor 20. A source electrode of FET 31 is connected to voltage supply conductor 20. A sensing resistor 37 and an inductor 38 are coupled between a voltage supply conductor 40 and the drain electrode of FET 31. Voltage supply conductor 40 is at an operating potential of amplifier 30. By way of example, voltage supply conductor 40 is at a potential of approximately 24 volts (V) relative to ground potential at voltage supply conductor 20. Input terminals 21 and 22 of compensation circuit 10 are coupled across sensing resistor 37.

The gate electrode of FET 41 is coupled via an impedance matching element 42 to the drain electrode of FET 31. Resistors 43 and 44 coupled between output terminal 23 of compensation circuit 10 and voltage supply conductor 20 form a voltage divider 46. An electrode of resistor 43 serves as a first terminal of voltage divider 46 and is connected to output terminal 23 of compensation circuit 10. Another electrode of resistor 43 and an electrode of resistor 44 form a voltage output terminal of voltage divider 46, which is connected to the gate electrode of FET 41. Another electrode of resistor 44 serves as a second terminal of voltage divider 46 and is connected to voltage supply conductor 20. A source electrode of FET 41 is connected to voltage supply conductor 20. The drain electrode of FET 41 is coupled to voltage supply conductor 40 via an inductor 48. The drain electrode of FET 41 is also connected to an RF signal output terminal 45 of amplifier 30 for transmitting an RF output signal of amplifier 30.

Impedance matching element 32 matches the input impedance of amplifier 30 to an output impedance of a circuit (not shown) that provides the RF input signal to RF amplifier 30. Impedance matching element 42 matches the input impedance of the second amplification element to the output impedance of the first amplification element. Impedance matching elements 32 and 42 typically include capacitors, inductors, and/or resistors. Inductors 38 and 48 serve as AC signal blocking elements and can be replaced with other types of devices or circuit elements capable of blocking AC signals, e.g., resistors, low pass filters, etc.

It should be understood that amplifier 30 is not limited to being a two stage amplifier as shown in FIG. 1. Amplifier 30 can have any number of amplification stages or elements, e.g., one, three, four, five, etc. Moreover, an amplification element in amplifier 30 is not limited to including an N channel LDMOS device like FET 31 or FET 41. It can include any type of transistor such as, for example, a bipolar transistor, a vertical diffusion FET, a graded channel FET, a FET with a uniformly doped channel, or the like. Further, an amplification element in amplifier 30 can include more than one transistor.

In operation, the operating potential at voltage supply conductor 40 establishes a first quiescent current flowing from the drain electrode to the source electrode of FET 31 and a second quiescent current flowing from the drain electrode to the source electrode of FET 41. The quiescent drain current flowing in FET 31 generates a sensing signal or a sensing voltage across sensing resistor 37. Through input terminals 21 and 22 of compensation circuit 10, the sensing voltage is applied across resistor 16, the emitter-base junction of transistor 11, and resistor 17. The voltage divider formed by resistors 14 and 15 establishes a reference voltage across resistor 16 and the emitter-base junction of transistor 12. Transistors 11 and 12 compare the sensing voltage and the reference voltage and generates a difference signal accordingly. If the voltage across the emitter-base junction of transistor 11 is higher than that across the emitter-base junction of transistor 12, the collector current in transistor 11 increases and the collector current in transistor 12 decreases. A difference signal of a first polarity is generated. The voltage at output terminal 23 of compensation circuit 10 is driven down. This bias signal of compensation circuit 10 is transmitted to the gate electrode of FET 31 via voltage divider 36. FET 31 is turned down, thereby decreasing the quiescent drain current flowing therethrough. On the other hand, the collector current in transistor 11 decreases and the collector current in transistor 12 increases if the voltage across the emitter-base junction of transistor 11 is lower than that across the emitter-base junction of transistor 12. A difference signal of a second polarity opposite to the first polarity is generated. The voltage at output terminal 23 of compensation circuit 10 is driven up. This bias signal of compensation circuit 10 is transmitted to the gate electrode of FET 31 via voltage divider 36. FET 31 is turned on, thereby increasing the quiescent drain current flowing therethrough. An equilibrium state is reached when the voltages across the emitter-base junctions of transistors 11 and 12 are substantially equal to each other. At the equilibrium state, the quiescent drain current in FET 31 is determined by the reference voltage established by the voltage divider formed by resistors 14 and 15 and transmitted to the base electrode of transistor 12 in compensation circuit 10.

The bias signal at output terminal 23 of compensation circuit 10 is also transmitted to the gate electrode of FET 41 via voltage divider 46. Therefore, compensation circuit 10 also adjusts the quiescent drain current in FET 41 by adjusting the gate voltage of FET 41. Because FETs 31 and 41 are devices of the same family, their characteristics substantially track each other. For example, the threshold voltage drifts of FETs 31 and 41 caused by hot carrier injection substantially track each other. Therefore, compensation circuit 10 is capable of maintaining optimal DC biasing points in both FETs 31 and 41 by monitoring the quiescent drain current in FET 31. It should be noted that although the quiescent drain current in FET 41 is adjusted by monitoring the quiescent drain current in FET 31, this does not mean that the quiescent drain currents in FETs 31 and 41 are equal to each other. Typically in a multiple stage amplifier, the first stage is a small signal amplification element and a subsequent stage is a large signal amplification element, and the quiescent current in the subsequent stage is larger than the quiescent current in the first stage. Thus, the quiescent drain current in FET 41 is usually larger than the quiescent drain current in FET 31. Because the quiescent drain current in FET 41 is adjusted by monitoring the quiescent drain current in FET 31, FET 41 does not need a sensing resistor serially coupled in its DC conduction path. This significantly improves the power efficiency of amplifier 30. The voltage overhead of FET 41 is also improved, thereby improving the linearity of FET 41. In addition, FET 41 is capable of operating in both class A mode and in class AB mode.

Figure 2:
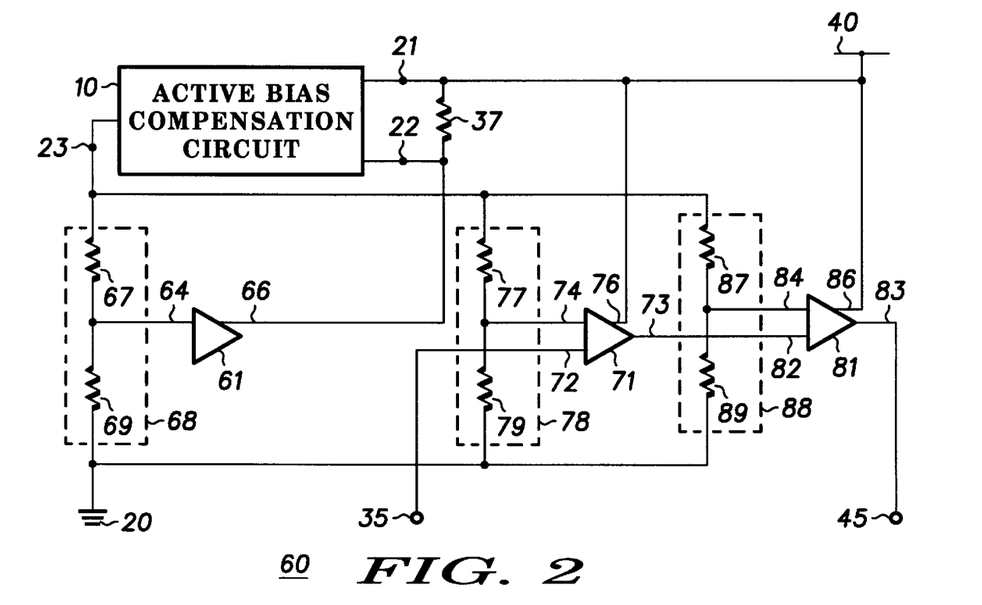
FIG. 2 is a schematic diagram of an amplifier with active quiescent current compensation in accordance with a second embodiment of the present invention.

FIG. 2 is a schematic diagram of an amplifier 60 with active quiescent current compensation in accordance with a second embodiment of the invention. Amplifier 60 includes an active bias compensation circuit 10 which is similar to active bias compensation circuit 10 of FIG. 1 in terms of structures and functions. Compensation circuit 10 is also referred to as a current feedback difference amplifier. Amplifier 60 includes amplification elements 61, 71, and 81. Preferably, amplification elements 61, 71, and 81 include transistors of the same family so that their characteristics substantially track each other. Transistors suitable for use in amplification elements 61, 71, and 81 include FETs, bipolar transistors, etc. In accordance with the embodiment shown in FIG. 2, amplification element 61 does not process or amplify any RF signal. Therefore, amplifier 60 is a two stage amplifier. Amplification element 61 establishes a quiescent current. Compensation circuit 10 uses the quiescent current in amplification element 61 as a reference quiescent current to adjust the quiescent currents in amplification elements 71 and 81. Therefore, amplification element 61 is also referred to as a quiescent current reference element.

Quiescent current reference element 61 has a DC bias terminal 64 and a DC current supply terminal 66. A voltage divider 68 includes resistors 67 and 69 and couples DC bias terminal 64 to output terminal 23 of compensation circuit 10. An electrode of resistor 67 serves as a first terminal of voltage divider 68 and is connected to output terminal 23 of compensation circuit 10. Another electrode of resistor 67 and an electrode of resistor 69 form a voltage output terminal of voltage divider 68, which is connected to DC bias terminal 64. Another electrode of resistor 69 serves as a second terminal of voltage divider 68 and is connected to voltage supply conductor 20. Sensing resistor 37 is serially coupled between voltage supply conductor 40 and DC current supply terminal 66. Input terminals 21 and 22 of compensation circuit 10 are coupled across sensing resistor 37.

Amplification element 71 has an input terminal 72, an output terminal 73, a DC bias terminal 74, and a DC current supply terminal 76. Input terminal 72 is connected to RF signal input terminal 35 of amplifier 60 for receiving an RF input signal. A voltage divider 78 includes resistors 77 and 79 and couples DC bias terminal 74 to output terminal 23 of compensation circuit 10. An electrode of resistor 77 serves as a first terminal of voltage divider 78 and is connected to output terminal 23 of compensation circuit 10. Another electrode of resistor 77 and an electrode of resistor 79 form a voltage output terminal of voltage divider 78, which is connected to DC bias terminal 74. Another electrode of resistor 79 serves as a second terminal of voltage divider 78 and is connected to voltage supply conductor 20. DC current supply terminal 76 is connected to voltage supply conductor 40.

Amplification element 81 has an input terminal 82, an output terminal 83, a DC bias terminal 84, and a DC current supply terminal 86. Input terminal 82 is connected to output terminal 73 of amplification element 71. Output terminal 83 is connected to RF signal output terminal 45 of amplifier 60 for transmitting an RF output signal. A voltage divider 88 includes resistors 87 and 89 and couples DC bias terminal 84 to output terminal 23 of compensation circuit 10. An electrode of resistor 87 serves as a first terminal of voltage divider 88 and is connected to output terminal 23 of compensation circuit 10. Another electrode of resistor 87 and an electrode of resistor 89 form a voltage output terminal of voltage divider 88, which is connected to DC bias terminal 84. Another electrode of resistor 89 serves as a second terminal of voltage divider 88 and is connected to voltage supply conductor 20. DC current supply terminal 86 is connected to voltage supply conductor 40.

It should be noted that each of reference element 61 and amplification elements 71 and 81 can include any number of transistors, e.g., one, two, three, etc. It should also be noted that amplifier 60 is not limited to being a two stage amplifier as shown in FIG. 2. Amplifier 60 can include one reference element, i.e., reference element 61, and any number of amplification elements, e.g., one, three, four, five, etc. For an amplification element, the DC bias terminal and the input terminal are not limited to being two distinct terminals, and the DC current supply terminal and the output terminal are not limited to being two distinct terminals. For example, FET 41 shown in FIG. 1 is an amplification element in amplifier 30. The gate electrode of FET 41 serves as both the DC bias terminal and the input terminal of the amplification element, and the drain electrode of FET 41 serves as both the DC current supply terminal and the output terminal of the amplification element.

In operation, a quiescent current flowing in reference element 61 flows through sensing resistor 37 and generates a sensing voltage across sensing resistor 37. Compensation circuit 10 senses the sensing voltage through input terminals 21 and 22 and generates a bias signal in a way similar to that described hereinabove with reference to FIG. 1. The bias signal of compensation circuit 10 is transmitted to DC bias terminal 64 of reference element 61 via voltage divider 68 and adjusts the quiescent current flowing in reference element 61. The bias signal of compensation circuit 10 is also transmitted to DC bias terminal 74 of amplification element 71 via voltage divider 78 and adjusts the quiescent current flowing in amplification element 71. In addition, the bias signal of compensation circuit 10 is transmitted via voltage divider 88 to DC bias terminal 84 of amplification element 81 and adjusts the quiescent current flowing in amplification element 81.

Therefore, compensation circuit 10 maintains optimal DC biasing points in amplification elements 71 and 81 by monitoring the quiescent current in reference element 61. It should be noted that although the quiescent currents in amplification elements 71 and 81 are adjusted by monitoring the quiescent current in reference element 61, this does not mean that the quiescent currents in reference element 61 and amplification elements 71 and 81 are equal to each other. Preferably, reference element 61 conducts a quiescent current significantly smaller than that in either amplification element 71 or amplification element 81. Because the quiescent currents in amplification elements 71 and 81 are adjusted by monitoring the quiescent drain current in reference element 61, amplification elements 71 and 8i do not need sensing resistors serially coupled in their DC conduction paths. This significantly improves the power efficiency of amplifier 60. The voltage overhead of the transistors in amplification elements 71 and 81 are also improved, thereby improving the linearity of amplifier 60. Because reference element 61 does not process any AC signal, its voltage overhead does not affect the performance of amplifier 60. In addition, amplification elements 71 and 81 are capable of operating as both class A amplifiers and in class AB amplifiers.

Figure 3:
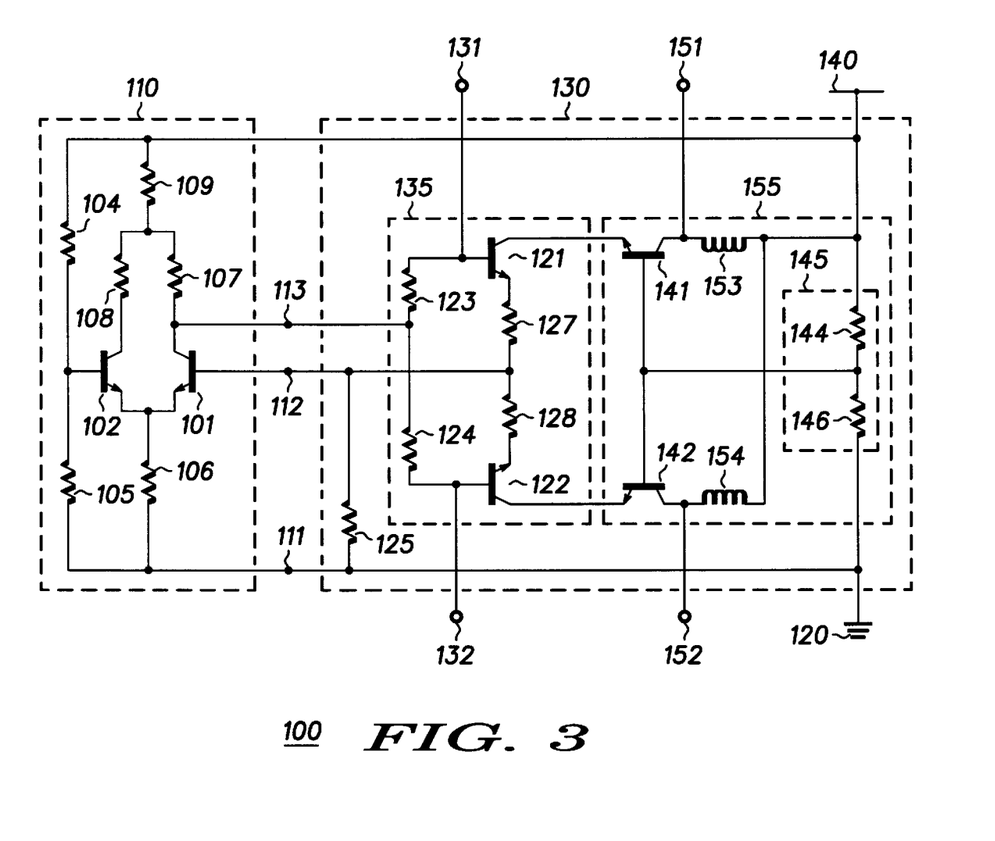
FIG. 3 is a schematic diagram of a wide band RF power amplifier with active quiescent current compensation in accordance with a third embodiment of the present invention.

FIG. 3 is a schematic diagram of a wide band radio frequency power amplifier 100 with quiescent current compensation in accordance with a third embodiment of the present invention. Amplifier 100 includes an active bias compensation circuit 110 and an amplification element 130. Active bias compensation circuit 110 monitors and adjusts a quiescent current in amplification element 130 to maintain an optimal biasing point of amplification element 130. For simplicity, amplification element 130 is also referred to as an amplifier. By way of example, amplifier 130 is a push-pull cascode high performance linear amplifier. It should be noted that FIG. 3 only shows elements in amplifier 100 that are essential to the description of the DC operation of amplifier 100. Amplifier 100 includes many other elements such as, for example, impedance matching elements, AC signal blocking elements, AC signal shunt elements, signal decoupling elements, etc., which are not shown in FIG. 3.

Compensation circuit 110 includes a difference amplifier formed by two sensing transistors 101 and 102. By way of example, sensing transistors 101 and 102 are NPN bipolar transistors. A base electrode of transistor 102 is coupled via a resistor 104 to a voltage supply conductor 140 at a first operating potential, e.g., approximately 24 V, of amplifier 100. The base electrode of transistor 102 is also coupled via a resistor 105 to a first input terminal 111 of compensation circuit 110. A resistor 106 couples an emitter electrode of transistor 101 and an emitter electrode of transistor 102 to input terminal 111. A base electrode of transistor 101 is connected to a second input terminal 112 of compensation circuit 110. A collector electrode of transistor 101 is connected to an electrode of a resistor 107. A collector electrode of transistor 102 is connected to an electrode of a resistor 108. The other electrodes of resistors 107 and 108 are coupled to voltage supply conductor 140 via a resistor 109. The collector electrode of transistor 101 is also connected to an output terminal 113 of compensation circuit 110. Compensation circuit 110 operates on DC signals to monitor and adjust the quiescent current in amplifier 130. Therefore, compensation circuit 110 is also referred to as a current feedback difference amplifier. It should be noted that transistors 101 and 102 in compensation circuit 110 are not limited to being NPN bipolar transistors. They can be replaced with other types of transistors such as, for example, PNP bipolar transistors, FETs, or the like.

Amplifier 130 includes is a two stage amplifier that includes two amplification elements. A first amplification element 135 includes NPN transistors 121 and 122 in common emitter configurations, and a second amplification element 155 includes NPN transistors 141 and 142 in common base configurations. Transistors 121 and 141 form a cascode configuration. Therefore, a conduction path of transistor 141 is serially coupled with a conduction path of transistor 121. Likewise, transistors 122 and 142 form a cascode configuration. Therefore, a conduction path of transistor 142 is serially coupled with a conduction path of transistor 122.

A base electrode of transistor 121 is connected to an RF signal input terminal 131 for receiving a first RF input signal. A base electrode of transistor 122 is connected to an RF signal input terminal 132 for receiving a second RF input signal. By way of example, the first and second RF input signals are two components of a differential RF signal. The base electrodes of transistors 121 and 122 are also coupled to output terminal 113 of compensation circuit 110 via resistors 123 and 124, respectively. A node connected to resistors 123 and 124 is referred to as a DC bias terminal of amplification element 135. Resistors 123 and 124 serve as decoupling elements or AC signal blocking elements. The emitter electrodes of transistors 121 and 122 are coupled to input terminal 112 of compensation circuit 110 via resistors 127 and 128, respectively. The collector electrodes of transistors 121 and 122 function as a DC current supply terminal of amplification element 135. A sensing resistor 125 has a first electrode connected to input terminal 112 of compensation circuit 110 and a second electrode connected to input terminal 111 of compensation circuit 110. The second electrode of sensing resistor 125 is also connected to a voltage supply conductor 120. By way of example, voltage supply conductor 120 is at a second operating potential, e.g., ground potential, of amplifier 100. The collector electrodes of transistors 121 and 122 function two RF signal output terminals of amplification element 135 and are connected to the emitter electrodes of transistors 141 and 142, respectively, which function as two RF signal input terminals of amplification element 155. The emitter electrodes of transistors 141 and 142 also function as DC current supply terminals of amplification element 155, which are coupled to voltage supply conductor 120 via the conduction paths of transistors 121 and 122, respectively. A collector electrode of transistor 141 is connected to an RF signal output terminal 151 for transmitting a first RF output signal. A collector electrode of transistor 142 is connected to an RF signal output terminal 152 for transmitting a second RF output signal. Terminals 151 and 152 are also referred to as RF signal output terminals of amplification element 155. The first and second RF input signals are two components of a differential RF output signal of amplifier 100. The collector electrodes of transistors 141 and 142 are also coupled to voltage supply conductor 140 via inductors 153 and 154, respectively. A voltage divider 145 consisting of resistors 144 and 146 is coupled between voltage supply conductors 140 and 120. More particularly, an electrode of resistor 144 serves as a first terminal of voltage divider 145 which is connected to voltage supply conductor 140. Another electrode of resistor 144 and an electrode of resistor 146 form a voltage output terminal of voltage divider 145, which is connected to the base electrodes of transistors 141 and 142. Another electrode of resistor 146 serves as a second terminal of voltage divider 145 which is connected to voltage supply conductor 120.

It should be understood that amplifier 130 is not limited to being configured as a push-pull cascode amplifier. Amplifier 130 can be in any configuration. In one example, amplifier 130 is a single ended cascode amplifier that includes two transistors, e.g., transistors 121 and 141. In another example, amplifier 130 is a push-pull differential amplifier that includes two transistors, e.g., transistors 121 and 122.

In operation, a quiescent current flows from voltage supply conductor 140 through inductor 153, transistor 141, transistor 121, resistor 127, and sensing resistor 125 to voltage supply conductor 120, another quiescent current flows from voltage supply conductor 140 through inductor 154, transistor 142, transistor 122, resistor 128, and sensing resistor 125 to voltage supply conductor 120. The two quiescent currents generate a sensing voltage across sensing resistor 125. Through input terminals 111 and 112 of compensation circuit 110, the sensing voltage is applied across the base-emitter junction of transistor 101 and resistor 106. The voltage divider formed by resistors 104 and 105 establishes a reference voltage which is applied across the base-emitter junction of transistor 102 and resistor 106. If the voltage across the base-emitter junction of transistor 101 is higher than that across the base-emitter junction of transistor 102, the collector current in transistor 101 increases and the collector current in transistor 102 decreases. The voltage at output terminal 113 of compensation circuit 110 is driven down. This bias signal of compensation circuit 110 is transmitted to the base electrodes of transistors 121 and 122 via resistors 123 and 124, respectively. Transistors 121 and 122 are turned down, thereby decreasing the quiescent currents flowing there through. On the other hand, the collector current in transistor 101 decreases and the collector current in transistor 102 increases if the voltage across the base-emitter junction of transistor 101 is lower than that across the base-emitter junction of transistor 102. The voltage at output terminal 113 of compensation circuit 110 is driven up. This bias signal of compensation circuit 110 is transmitted to the base electrodes of transistors 121 and 122 via resistors 123 and 124, respectively. Transistors 121 and 122 are turned on, thereby increasing the quiescent currents flowing therethrough. An equilibrium state is reached when the voltages across the base-emitter junctions of transistors 101 and 102 are substantially equal to each other. At the equilibrium state, the quiescent currents in transistors 121 and 122 are determined by the reference voltage established by the voltage divider formed by resistors 104 and 105 and transmitted to the base electrode of transistor 102 in compensation circuit 110. Transistors 121 and 141 share the same DC conduction path. Therefore, the quiescent current in transistor 141 is the same as that in transistor 121. Likewise, transistors 122 and 142 share the same DC conduction path. Therefore, the quiescent current in transistor 142 is the same as that in transistor 122.

By now it should be appreciated that an active bias compensation circuit and a method for adjusting quiescent current have been provided. The active bias compensation circuit senses a quiescent current flowing in an amplifier and adjusts the quiescent current to maintain an optimal DC biasing of the amplifier over a wide range of factors, e.g., temperature variation, process variation, history of the amplifier, etc. When used for adjusting quiescent currents in a multiple stage amplifier, the active bias compensation circuit senses a quiescent current in a first amplification stage or a reference stage and generates bias signals to adjust quiescent currents in subsequent amplification stages. By sensing the quiescent current only in the first amplification stage or in the reference stage, the power efficiency of the amplifier is significantly improved. The active compensation circuit is simple and space efficient. It can be fabricated either on the same chip as the amplifier or on a different chip. Different stages in a multiple stage amplifier can also be fabricated on either on the same chip or on different chips. The compensation process is power efficient and cost efficient. The amplifiers using the active bias compensation of the present invention can be high performance wide band linear RF amplifiers. They are applicable in various applications such as, for example, cellular telephone base stations, television cable amplifiers, etc.

What is claimed is:

1. An amplifier with active bias compensation, comprising:

a first amplification element having a bias terminal, and a current supply terminal coupled to a first voltage supply conductor via a sensing resistor;

an active bias compensation circuit having a first input and a second input coupled across the sensing resistor for sensing a quiescent current in the first amplification element, and an output coupled to the bias terminal of the first amplification element, wherein the active bias compensation circuit includes:

a first transistor having a control electrode coupled to the first input of the active bias compensation circuit, a first current conducting electrode, and a second current conducting electrode;

a second transistor having a control electrode coupled for receiving a reference voltage, a first current conducting electrode coupled to the first current conducting electrode of the first transistor, and a second current conducting electrode coupled to the output of the active bias compensation circuit;

a first resistor having a first electrode coupled to a first voltage supply conductor and a second electrode coupled to the first current conducting electrode of the first transistor; and a second resistor having a first electrode coupled to the second current conducting electrode of the first transistor and a second electrode coupled to the second input of the active bias compensation circuit; and a second amplification element having a quiescent current tracking the quiescent current in the first amplification element.

2. The amplifier of claim 1, wherein:

the control electrode of the second transistor is coupled for receiving the reference voltage via a voltage divider; and the voltage divider includes:
- a third resistor having a first electrode coupled to the first voltage supply conductor and a second electrode coupled to the control electrode of the second transistor; and
- a fourth resistor having a first electrode coupled to the control electrode of the second transistor and a second electrode coupled to a second voltage supply conductor.

3. An amplifier with active bias compensation, comprising:
- a first amplification element having a bias terminal, and a current supply terminal coupled to a first voltage supply conductor via a sensing resistor;
- an active bias compensation circuit having a first input and a second input coupled across the sensing resistor for sensing a quiescent current in the first amplification element, and an output coupled to the bias terminal of the first amplification element, wherein the active bias compensation circuit includes:
  - a first transistor having a control electrode coupled to the first input of the active bias compensation circuit, a first current conducting electrode, and a second current conducting electrode coupled to the output of the active bias compensation circuit;
  - a second transistor having a control electrode coupled for receiving a reference voltage, a first current conducting electrode coupled to the first current conducting electrode of the first transistor, and a second current conducting electrode;
  - a first resistor having a first electrode coupled to a first voltage supply conductor and a second electrode coupled to the first current conducting electrode of the first transistor; and
  - a second resistor having a first electrode coupled to the second current conducting electrode of the first transistor and a second electrode coupled to the second input of the active bias compensation circuit; and
  - a third resistor having a first electrode coupled to the second current conducting electrode of the second transistor and a second electrode coupled to the second input of the active bias compensation circuit; and
- a second amplification element having a quiescent current tracking the quiescent current in the first amplification element.

4. A radio frequency (RF) power amplifier, comprising:
- a sensing resistor having a first electrode coupled to a first operating potential, and a second electrode;
- a difference amplifier having a first input coupled to the first electrode of the sensing resistor, a second input coupled to the second electrode of the sensing resistor, and an output;
- a first amplification element having a bias terminal coupled to the output of the difference amplifier via at least one passive circuit element and no active elements and a current supply terminal coupled to the second electrode of the sensing resistor; and
- a second amplification element having a current supply terminal coupled to the first operating potential.

5. The RF power amplifier of claim 4, wherein the second amplification element further has a bias terminal coupled to the output of the difference amplifier via at least one passive circuit element that is different from the at least one passive circuit coupling the first amplification element.

6. A radio frequency (RF) power amplifier, comprising:
- a sensing resistor having a first electrode coupled to a first operating potential, and a second electrode;
- a difference amplifier having a first input coupled to the first electrode of the sensing resistor, a second input coupled to the second electrode of the sensing resistor, and an output;
- a first amplification element having a bias terminal coupled to the output of the difference amplifier, a current supply terminal coupled to the second electrode of the sensing resistor, an RF signal input coupled for receiving an RF signal of the RF power amplifier, and an RF signal output; and
- a second amplification element having a current supply terminal coupled to the first operating potential, a bias terminal coupled to the output of the difference amplifier, an RF signal input coupled to the RF signal output of the first amplification element and an RF signal output.

7. The RF power amplifier of claim 6, wherein:
- the first amplification element is a small signal amplification element; and
- the second amplification element is a large signal amplification element.

8. A radio frequency (RF) power amplifier, comprising:
- a sensing resistor having a first electrode coupled to a first operating potential, and a second electrode;
- a difference amplifier having a first input coupled to the first electrode of the sensing resistor, a second input coupled to the second electrode of the sensing resistor, and an output;
- a first amplification element having a bias terminal coupled to the output of the difference amplifier and a current supply terminal coupled to the second electrode of the sensing resistor, wherein the first amplification element is a quiescent current bias reference element; and
- a second amplification element having a current supply terminal coupled to the first operating potential, a bias terminal coupled to the output of the difference amplifier, and an RF signal input coupled for receiving an RF signal input to the RF power amplifier and an RF signal output.

9. The RF power amplifier of claim 8, further comprising a third amplification element having a bias terminal coupled to the output of the difference amplifier, a current supply terminal coupled to the first operating potential, an RF signal input coupled to the RF signal output of the second amplification element, and an RF signal output.

10. A radio frequency (RF) power amplifier, comprising:
- a sensing resistor having a first electrode coupled to a first operating potential, and a second electrode;
- a difference amplifier having a first input coupled to the first electrode of the sensing resistor, a second input coupled to the second electrode of the sensing resistor, and an output;
- a first amplification element having a bias terminal coupled to the output of the difference amplifier and a current supply terminal coupled to the second electrode of the sensing resistor, wherein the first amplification element includes:
  - a first transistor having a control electrode coupled for receiving a first RF input signal, a first current conducting electrode, and a second current conducting electrode;
  - a first alternating current signal blocking element having a first electrode coupled to the bias terminal of the first amplification element and a second electrode coupled to the control electrode of the first transistor; and a first resistor having a first electrode coupled to the first current conducting electrode of the first transistor and a second electrode coupled to the current supply terminal of the first amplification element; and a second amplification element having a current supply terminal coupled to the first operating potential.

11. The RF power amplifier of claim 10, wherein first amplification element further includes:

a second transistor having a control electrode coupled for receiving a second RF input signal, a first current conducting electrode, and a second current conducting electrode;

a second alternating current signal blocking element having a first electrode coupled to the bias terminal of the first amplification element and a second electrode coupled to the control electrode of the second transistor; and a second resistor having a first electrode coupled to the first current conducting electrode of the second transistor and a second electrode coupled to the current supply terminal of the first amplification element.

12. The RF power amplifier of claim 11, wherein second amplification element includes:

a voltage divider having a first terminal coupled to the first operating potential, a second terminal coupled to a second operating potential, and a voltage output terminal;

a third transistor having a control electrode coupled to the voltage output terminal of the voltage divider, a first current conducting electrode coupled to the second current conducting electrode of the first transistor, and a second current conducting electrode coupled for transmitting a first RF output signal;

a fourth transistor having a control electrode coupled to the voltage output terminal of the voltage divider, a first current conducting electrode coupled to the second current conducting electrode of the second transistor, and a second current conducting electrode coupled for transmitting a second RF output signal;

a third alternating current signal blocking element having a first electrode coupled to the second current conducting electrode of the third transistor and a second electrode coupled to the second operating potential; and a fourth alternating current signal blocking element having a first electrode coupled to the second current conducting electrode of the fourth transistor and a second electrode coupled to the second operating potential.

13. The RF power amplifier of claim 10, wherein the current supply terminal of the second amplification element is coupled to the first operating potential via the first transistor, the first resistor, and the sensing resistor, and wherein second amplification element includes:

a second transistor having a control electrode, a first current conducting electrode coupled to the second current conducting electrode of the first transistor, and a second current conducting electrode coupled for transmitting a first RF output signal;

a second alternating current signal blocking element having a first electrode coupled to the second current conducting electrode of the second transistor and a second electrode coupled to a second operating potential; and a voltage divider having a first terminal coupled to the first operating potential, a second terminal coupled to the second operating potential, and a voltage output terminal coupled to the control electrode of the second transistor.

14. A radio frequency (RF) power amplifier, comprising:

a sensing resistor having a first electrode coupled to a first operating potential, and a second electrode;

a difference amplifier having a first input coupled to the first electrode of the sensing resistor, a second input coupled to the second electrode of the sensing resistor, and an output, wherein the difference amplifier includes:

a first resistor having a first electrode coupled to the first input of the difference amplifier, and a second electrode;

a first transistor having a control electrode coupled to the second input of the difference amplifier, a first current conducting electrode coupled to the second electrode of the first resistor, and a second current conducting electrode;

a second transistor having a control electrode coupled for receiving a reference voltage, a first current conducting electrode coupled to the second electrode of the first resistor, and a second current conducting electrode coupled to the output of the difference amplifier; and a second resistor having a first electrode coupled to the second current conducting electrode of the first transistor and a second electrode coupled to a second operating potential;

a first amplification element having a bias terminal coupled to the output of the difference amplifier and a current supply terminal coupled to the second electrode of the sensing resistor; and a second amplification element having a current supply terminal coupled to the first operating potential.

15. A radio frequency (RF) power amplifier, comprising:

a sensing resistor having a first electrode coupled to a first operating potential, and a second electrode;

a difference amplifier having a first input coupled to the first electrode of the sensing resistor, a second input coupled to the second electrode of the sensing resistor, and an output, wherein the difference amplifier includes:

a first transistor having a control electrode coupled to the second input of the difference amplifier, a first current conducting electrode, and a second current conducting electrode coupled to the output of the difference amplifier;

a second transistor having a control electrode coupled for receiving a reference voltage, a first current conducting electrode coupled to the first current conducting electrode of the first transistor, and a second current conducting electrode;

a first resistor having a first electrode coupled to the second current conducting electrode of the first transistor and a second electrode coupled to a second operating potential;

a second resistor having a first electrode coupled to the second current conducting electrode of the second transistor and a second electrode coupled to the second electrode of the first resistor; and a third resistor having a first electrode coupled to the first input of the difference amplifier and a second electrode coupled to the first current conducting electrode of the first transistor;

a first amplification element having a bias terminal coupled to the output of the difference amplifier and a current supply terminal coupled to the second electrode of the sensing resistor; and a second amplification element having a current supply terminal coupled to the first operating potential.

16. A method for adjusting a quiescent current, comprising:

serially coupling a sensing resistor with a conduction path of a first amplification element;

establishing the quiescent current flowing through the conduction path of the first amplification element;

generating a sensing voltage across the sensing resistor;

generating a bias signal applied to a bias terminal of the first amplification element in accordance with the sensing voltage to adjust the quiescent current by applying the sensing voltage to a control electrode of a first transistor; applying a reference voltage to a control electrode of a second transistor; and adjusting the quiescent current flowing in the first amplification element to match a current flowing in the first transistor and a current flowing in the second transistor;

establishing a second quiescent current flowing through a conduction path of a second amplification element; and adjusting the second quiescent current flowing through the conduction path of the second amplification element in accordance with the quiescent current flowing through the conduction path of the first amplification element.

17. The method as claimed in claim 16, wherein the step of adjusting the second quiescent current includes the step of applying the bias signal to a bias terminal of the second amplification element to adjust the second quiescent current.

18. The method as claimed in claim 16, wherein the step of establishing a second quiescent current includes the step of serially coupling the conduction path of the second amplification element with the first amplification element.

* * * * *